United States Patent [19]
Krivoshlykov

[11] Patent Number: 5,574,818
[45] Date of Patent: Nov. 12, 1996

[54] COMPOUND WAVEGUIDE LASERS AND OPTICAL PARAMETRIC OSCILLATORS

[75] Inventor: Sergej G. Krivoshlykov, Moscow, Russian Federation

[73] Assignee: CeramOptec Industries, Inc., East Longmeadow, Mass.

[21] Appl. No.: 509,875

[22] Filed: Aug. 1, 1995

[51] Int. Cl.$^6$ ........................................... G02F 1/39
[52] U.S. Cl. .......................... 385/122; 359/330; 359/332; 372/22
[58] Field of Search ................. 385/27–30, 122; 359/326–332; 372/21, 22

[56] References Cited

U.S. PATENT DOCUMENTS 3,822,927  7/1974  Zernike .............................. 359/332 X
4,922,496  5/1990  Po ...................................... 359/328 X
5,276,758  1/1994  Hughes .............................. 385/122 X

*Primary Examiner*—John D. Lee
*Attorney, Agent, or Firm*—Bolesh J. Skutnik

[57] ABSTRACT

A new family of lasers and optical parametric oscillators is based on efficient frequency conversion or doubling in multimode compound optical waveguides. These waveguides exploit specific useful properties of their higher order modes while providing good compatibility with single-mode optical fibers. A mode engineering approach is applied to construct a compound waveguide structure that supports a higher order mode having a sharp peak in its field. This sharp peak simplifies selection of this mode by efficient coupling of its radiation into a single-mode fiber. The lasers and optical parametric oscillators employ wavelength selective properties of this mode field configuration and its unique ability to support efficient frequency conversion and doubling.

20 Claims, 4 Drawing Sheets

COMPOUND WAVEGUIDE LASERS AND OPTICAL PARAMETRIC OSCILLATORS

BACKGROUND OF THE INVENTION

1. Field of the Invention

The present invention relates to optical sources of coherent radiation and in particular to a new class of short wavelength lasers and optical parametric oscillators based of the frequency conversion or doubling inside a multimode waveguide. Such short wavelength microlasers have many important industrial, military and medical applications.

2. Information Disclosure Statement

Short wavelength lasers (green-blue lasers) and tunable frequency lasers have found many important scientific, industrial, military and medical applications. Some of this devices are commercially available and miniaturization of these lasers is required for many practical applications. Unfortunately, it is difficult to find appropriate active materials required for short radiation wavelengths. For example, in order to design short wavelength semiconductor lasers new semiconductor materials having a large energy gap should be developed. One of the solution of the problem is based on employing the effect of frequency conversion or doubling in appropriate nonlinear materials to lower the wavelength of radiation. A green wavelength laser based on this principle is now commercially available. Scaling of its output power, however, has some major restrictions. The design of the lasers based on frequency conversion or doubling requires both a means for high amplification of the fundamental frequency beam in an active laser material and a means for efficient frequency conversion in a nonlinear material. To enhance the efficiency of frequency conversion or doubling in a given nonlinear material one should increase the power of the fundamental frequency beam and the length of the nonlinear medium. Enhancing amplification of the beam in a given active laser material also requires increasing the length of the active laser medium. Moreover, conditions to effectively pump the active laser media should be provided. All these problems can be solved with lasers based on multimode waveguide structures. Relatively large cross section and large length of the multimode waveguide provides conditions to efficient pump the active material while the waveguiding properties of the nonlinear material provide strong field confinement over a large distance, as required for efficient frequency conversion.

Unfortunately, using standard multimode nonlinear waveguides can not provide efficient frequency conversion since the mode fields corresponding to the fundamental frequency and the converted frequency (second harmonic) do not overlap sufficiently. Moreover, it is not easy to realize phase matching in such multimode nonlinear waveguides as required for efficient frequency conversion. To provide this phase matching one should fabricate, for example, special periodicity or gratings inside the waveguide. In addition, the work with standard multimode waveguides requires the complicated processing of a mode speckle pattern at the waveguide output. The difficulty of coupling of the output beam into a single-mode information transmission fiber network also remain problems to be solved. These problems have severely restricted deteriorated the use of multimode waveguides in their applications.

It is the aim of the present invention to describe novel types of short wavelength lasers and optical parametric oscillators based on a new family of compound multimode optical waveguides which are designed to exploit specific useful properties of their higher order modes while providing good compatibility with single-mode optical fibers. A special compound structure of the compound multimode waveguides provides a unique possibility to achieve wavelength selection, efficient overlap of the modal fields corresponding to different frequencies and good phase matching. This compound waveguide structure supports modes having sharp peaks of their fields in the nonlinear waveguide region that also enhances the frequency conversion efficiency. Moreover, existence of this peak simplifies selection of this mode and efficient coupling of its radiation into a single-mode fiber networks. The combination of all these factors makes the system really unique.

OBJECTS AND SUMMARY OF THE INVENTION

It is an object of the present invention to provide a short wavelength enhanced power laser based of efficient frequency doubling inside a multimode waveguide.

Another object is to provide an optical parametric oscillator based of efficient frequency conversion inside a multimode waveguide.

Further object is to specify a structure of compound multimode waveguide providing efficient frequency doubling.

Still other object is to specify a structure of the compound multimode waveguide providing efficient frequency conversion.

Still other object is to provide effective coupling of the light from the laser or optical parametric oscillator into a single-mode output fiber.

An additional object is to specify some active and nonlinear optical materials that can be used to fabricate such short wavelength lasers and optical parametric oscillators.

Briefly stated, the present invention describes a new family of lasers and optical parametric oscillators which is based on efficient frequency conversion or doubling in multimode compound optical waveguides. These waveguides exploit specific useful properties of their higher order modes while providing good compatibility with single-mode optical fibers. A mode engineering approach is applied to construct a compound waveguide structure that supports a higher order mode having a sharp peak in its field. This sharp peak simplifies selection of this mode by efficient coupling of its radiation into a single-mode fiber. The lasers and optical parametric oscillators employ wavelength selective properties of this mode field configuration and its unique ability to support efficient frequency conversion and doubling.

The above, and other objects, features and advantages of the present invitation will become apparent from the following description read in conjunction with the accompanying drawings.

DESCRIPTION OF PREFERRED EMBODIMENTS

The present invention describes new types of short wavelength lasers and optical parametric oscillators based on efficient frequency conversion or doubling inside a compound multimode waveguide exhibiting both active and nonlinear properties. A key component of these lasers is a compound multimode waveguide which provides conditions for efficient gain of the fundamental frequency mode in an active waveguide material, its efficient frequency conversion in nonlinear waveguide material and its efficient coupling into an output single-mode optical fiber networks. A mode engineering approach is developed and applied to construct a compound structure of the waveguide refractive index profile supporting higher order modes that exhibit properties which are desirable for each specific application. One of the main goals of the construction is to identify conditions where the compound multimode waveguide structure guides a higher order mode exhibiting sharp peak in its field, while the fields of the other waveguide modes are mainly localized outside this peak region. Existence of this peak provides conditions for efficient frequency conversion, and simplifies selection of this mode and the efficient coupling of its radiation into a single-mode fiber.

Figure 1A:
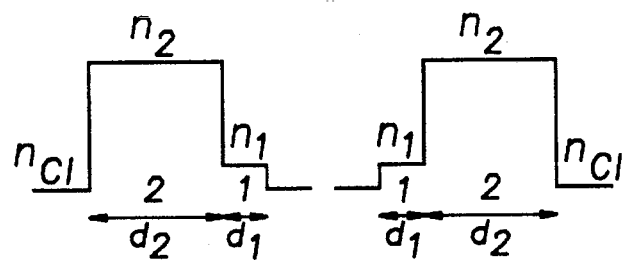
FIG. 1. Waveguide profiles (a,c) and TM mode field $H_x$ (arbitrary units) as a function of transverse coordinate $\gamma$ (b,d).
Figure 1B:
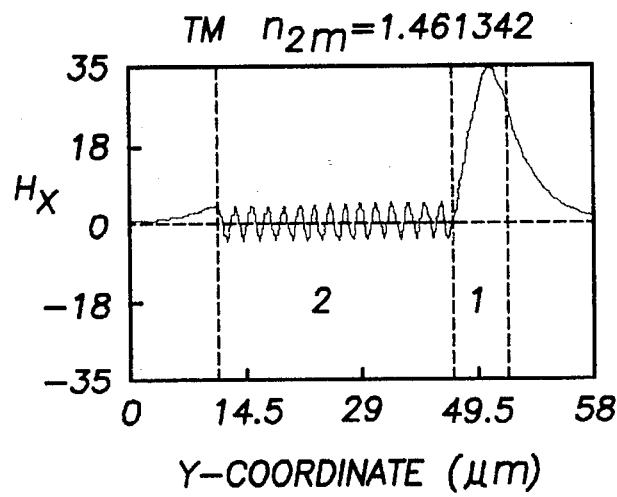

The basic idea of the mode engineering approach can be illustrated as follows. Consider two planar multimode waveguides having refractive index profiles as shown in FIG. 1(a). Refractive index profile of each of these waveguides can be considered to be constructed from a single-mode step index planar waveguide 1 (having core index $n_1$ and cladding index $n_{cl}$) and a multimode step index planar waveguide 2 (having core index $n_2$ and cladding index $n_{cl}$). It can be shown using general waveguide theory, that coupling of single-mode waveguide 1 to multimode waveguide 2 results in adding an extra mode to original multimode waveguide 2 which is close to the cut-off. In the case where the effective refractive index of this mode of a resulting compound waveguide is close to that of the fundamental mode in original waveguide 1 the field of this highest order mode exhibits sharp peak in the region of waveguide 1. The general condition for establishing the mode configuration having a sharp peak can be estimated approximately, employing the standard characteristic equation for multimode step index waveguide 2:

$$(2\pi d_2/\lambda)(n_2^2 - n_{2m}^2)^{1/2} = 2 \tan^{-1}[(n_{2m}^2 - n_{cl}^2)/(n_2^2 - n_{2m}^2)]^{1/2} + \pi m \quad (1)$$

in the case, when $n_{2m} = n_1^*$. Here $n_1^*$ is the effective index of the fundamental mode in initial single-mode waveguide 1, $n_{2m}$ is the effective index of the compound waveguide mode of order m, $\lambda$ is the wavelength and $d_2$ is the waveguide thickness defined in FIG. 1(a). An example of such mode having sharp peak is shown in FIG. 1(b) in the case when $\lambda=1.55$ μm, $n_{cl}=1.460$, $n_1=1.463$, $n_2=1.65$, $d_1=8$ μm and $d_2=30$ μm. The mode peak localized in region 1 carries the majority of the mode energy while some pan of the mode field propagates in region 2. The mode peak can be easily selected using an aperture. The width of the mode peak can be adjusted to be nearly that of a single-mode fiber by controlling the refractive index $n_1$ and thickness $d_1$ of region 1 in the compound multimode waveguide. This provides good compatibility of this specific mode of compound multimode waveguide to single-mode fiber networks.

The compound structure that characterizes this new family of waveguides offers some interesting possibilities for a new laser design. Consider a compound waveguide supporting a mode with a high intensity peak in which the high refractive index multimode region 2 is made up of a laser active material. Since multimode active region 2 can be relatively large (tens of micrometers) and can be made long (millimeters), it can be effectively pumped by sources such as diode lasers. If optical feedback is provided in the region 1 of the high intensity peak of the mode, then only a high order mode similar to that in FIG. 1(b) will grow inside the waveguide. The resulting laser beam will be characterized by a high field intensity in the single-mode low refractive index region 1. The mode tail propagating in region 2 extracts the energy from active media while the high field intensity of the mode peak in region 1 made from appropriate nonlinear material can be exploited for efficient parametric frequency conversion or second harmonic generation in the laser structures. An additional advantage of this scheme is that the main part of the frequency doubled mode field propagates outside the active waveguide region 2, because the active material in this region usually strongly absorbs the second harmonic radiation.

It follows from equation (1) that the mode peak appears periodically as a function of waveguide parameters $n_2$, $d_2$ and wavelength $\lambda$, each time when the condition $n_{2m}=n_1^*$ is satisfied. This occurs generally when the whole number of guided modes in the waveguide is changed by one. The periodic dependence of the mode peak intensity on waveguide parameters can be used to control the system.

It is possible to find a combination of the waveguide parameters when both the fundamental frequency mode and the convened frequency mode (the second harmonic) have the similar strongly overlapping mode field configurations and close effective refractive indices that enhance the frequency conversion. This unique property of the compound waveguide structure has important potential applications in miniature parametric oscillators and short wavelength waveguide lasers based on frequency conversion.

Note, that the structure exhibits desired mode peak for such region of the wavelengths $\lambda$, when the original waveguide 1 remains still essentially single-mode. To extend this region of wavelengths it is helpful to use air or another very low index material ($n<<n_{cl}$) as a cladding from the side of waveguide 1. Another possibility to extend this range of wavelengths and to improve performance of the system is to employ a symmetric waveguide structure analyzed below in more detail.

Figure 1C:
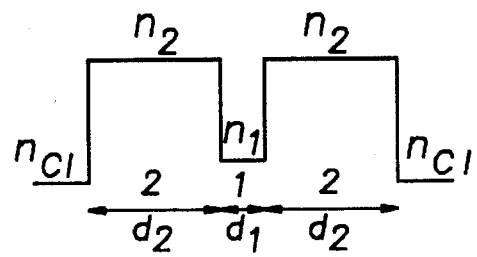
Figure 1D:
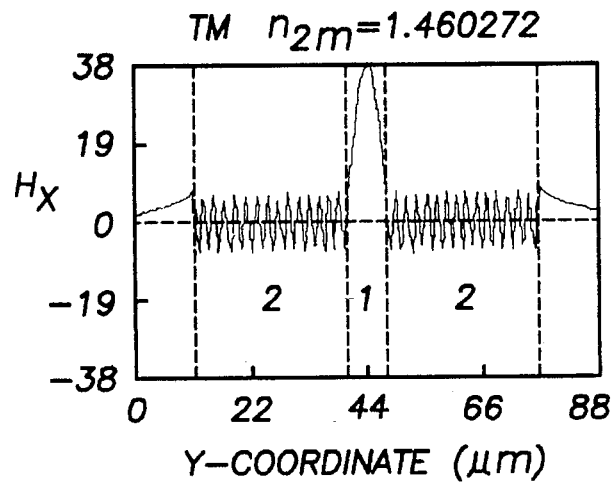

Bringing two waveguides shown in FIG. 1(a) together results in a new symmetric compound multimode waveguide having a large central dip as shown in FIG. 1(c). This waveguide also exhibits a highest order mode having sharp central peak in its field. An example of this mode is shown in FIG. 1(d) in the case when $\lambda=1.55$ μm, $n_{cl}=1.460$, $n_1=1.463$, $n_2=1.65$, $d_1=8$ μm and $d_2=30$ μm. This mode of the compound multimode waveguide is the result of constructive interference between the individual modes with sharp peaks belonging to each of the two original multimode waveguides shown in FIG. 1(a). Other modes are mostly localized outside the central region of the waveguide. Therefore, they practically do not contribute if the central mode peak is selected by some aperture in the central region of the compound waveguide.

Figure 2A:
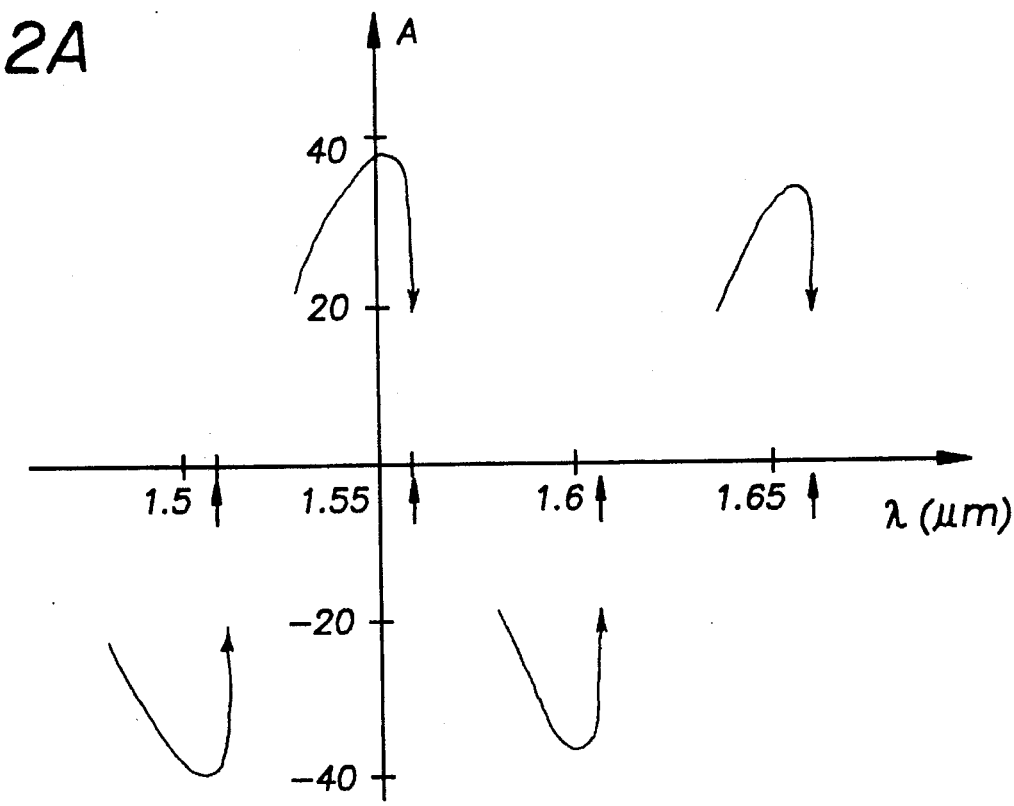
FIG. 2. Normalized mode peak amplitude A as a function of (a) wavelength $\lambda$, and (b) refractive index $n_2$.

The normalized amplitude of the peak of the mode field in the waveguide center is shown in FIG. 2(a) as a function of wavelength. The figure demonstrates a periodic dependence of the system transmission as a function of wavelength. Thus, the waveguide being tuned to an appropriate working point can operate as a narrow band filter. For example, the cut-off of the filter bands represented in FIG.

2(a) corresponds to the wavelengths λ=1510.0 nm, 1557.2 nm, 1607.0 nm, 1661.0 nm, etc. Increasing the wavelength at these points by only 0.1 nm results in a dramatic decrease of the central peak of the mode field. The wavelength selectivity of the field configuration exhibiting a sharp central peak can be exploited for wavelength selection, while their periodic dependence on wavelength can be employed for efficient frequency conversion in waveguide lasers and parametric oscillators. For example, in one preferred embodiment the waveguide structure is made from Nd:YAG crystal ($n_2$=1.81, $d_2$=18 μm,) having silica cladding ($n_{cl}$=1.460). The central part of this structure is made from doped fused silica ($n_1$=1.463, $d_1$=8 μm) which is thermoelectrically poled in strong electric field to provide its nonlinear properties. In this case, both the fundamental mode field configurations at λ=1.064 μm and its second harmonics at λ=0.532 μm are found to exhibit about the same mode fields (similar to that in FIG. 1(d)) and close effective mode refractive indices. This unique property of the waveguide structure provides almost perfect overlapping of the mode fields of the fundamental frequency beam and its second harmonic and good phase matching between these modes required for efficient frequency conversion.

Figure 2B:
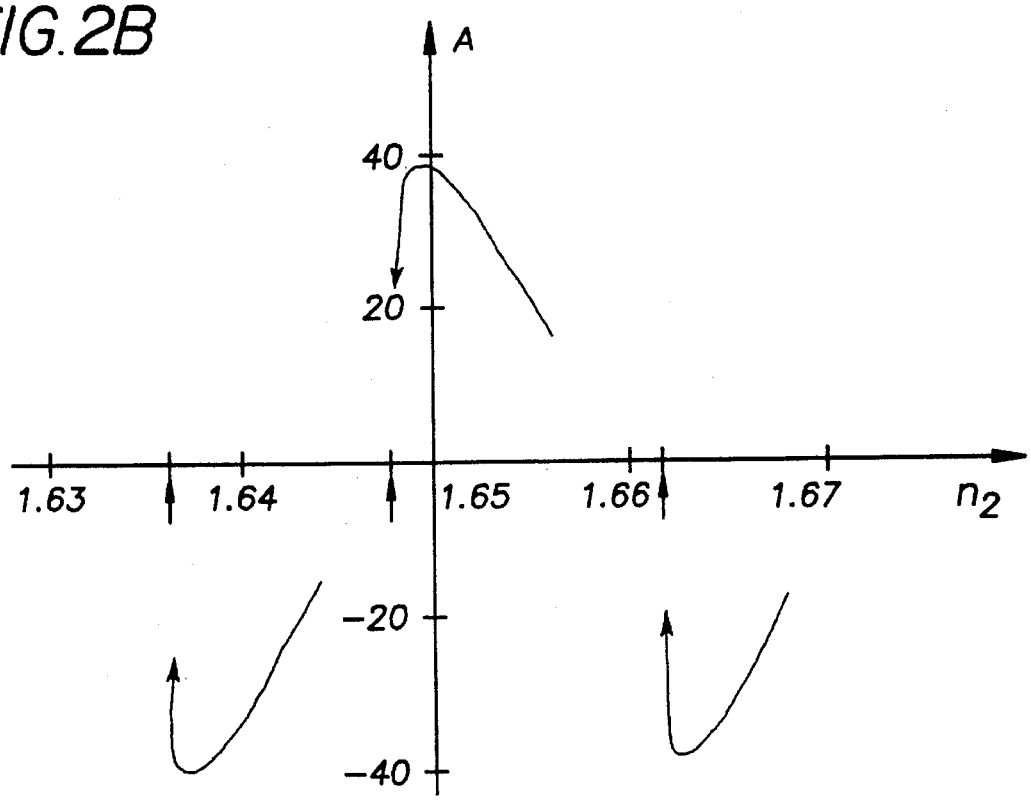

The amplitude of the central peak of the mode field has the same periodic dependence on both the waveguide core refractive index $n_2$ and the waveguide thickness $d_2$. The normalized amplitude of the central peak of the waveguide mode as a function of refractive index $n_2$ is shown in FIG. 2(b). The amplitude of the peak of the transmitted beam decreases sharply near cut-off of the original waveguide modes at values of the refractive index corresponding to $n_{2cut}$=1.6364, 1.6482, 1.6620, etc. when the index is varied by as little as $10^{-4}$–$10^{-5}$. This high sensitivity suggests that electro-optic, acousto-optic, thermo-optic effects or $\chi^{(3)}$-nonlinearity of core material can be used effectively to control the compound waveguide structure and to tune it to desired operating point.

Figure 3:
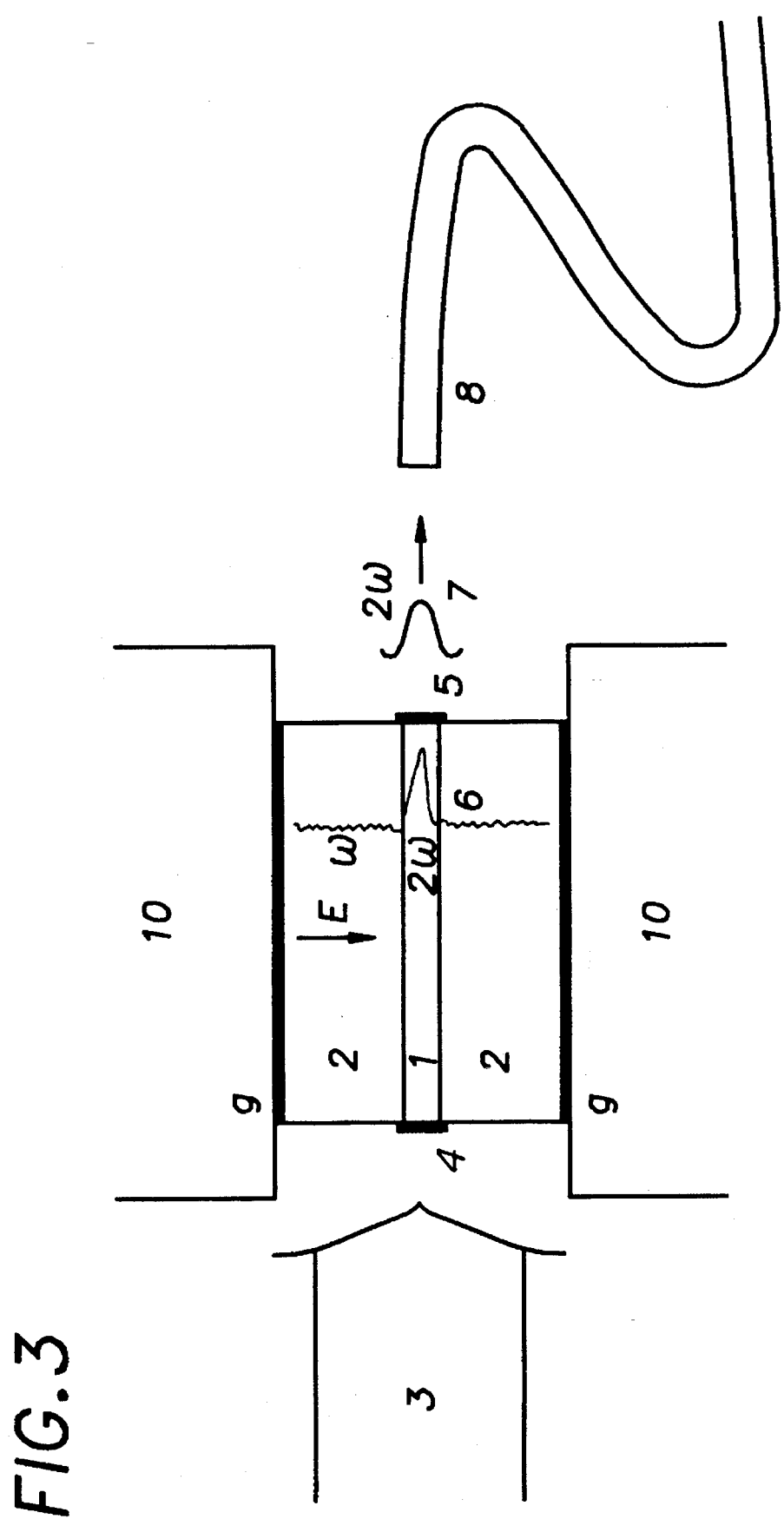
FIG. 3. Schematic of short wavelength laser based on symmetric compound waveguide structure.

One preferred embodiment of the short wavelength laser based on symmetric compound waveguide is schematically shown in FIG. 3. Single-mode nonlinear region 1 of the compound waveguide is surrounded with multimode active regions 2. The active compound structure of large cross section can be effectively pumped with beam 3 to generate the mode at frequency ω having sharp central peak in nonlinear single-mode region 1. Mirrors 4 and 5 fabricated in the single-mode region 1 and having reflective coefficients $R_4^\omega$=1 and $R_5^\omega$=1 for the fundamental frequency ω provide a feedback in the system only for one higher order mode 6 with sharp peak in region 1. The feedback for other modes in the compound waveguide structure is practically absent. Therefore, only mode 6 having sharp peak of its field in single-mode region 1 will grow inside the waveguide. Thus, mirrors 4 and 5 in the region of the mode peak perform also mode selection functions. Note, that selection of the mode with sharp peak can also be performed with the help of special computer generated hologram combined with at least one of mirrors 4,5. Simple aperture or end face of an output fiber can also be used for such mode selection. Note that a loop made from the output fiber can simultaneously be used instead of the mirrors as a convenient feedback means. Although the mode selection is not absolutely necessary for operation of the laser, it prevents amplification of other modes in the system resulting in useless consumption of the power of pumped active region 2.

Concentration of the mode power in its central peak inside nonlinear single-mode waveguide region 1 results in generation of the second harmonic having frequency 2ω. For appropriate choice of parameters of the compound waveguide structure the higher order mode of the second harmonic can have almost the same field configuration as the fundamental frequency mode 6 and its effective refractive index is well matched to that of the fundamental frequency mode. As a result of almost complete overlap of the mode fields for the fundamental beam and the second harmonic and their perfect phase matching, generation of the second harmonic in the compound waveguide structure can be very efficient. If mirror 4 completely reflects also light at doubled frequency 2ω($R_4^{2\omega}$=1) and mirror 5 transmits the light at this frequency ($R_5^{2\omega}$=0), then doubled frequency beam 7 will be irradiated from one side of the structure. This beam can then be effectively coupled to single mode fiber 8, if width of this beam is matched to the fundamental mode of this fiber. For better selection of the sharp central peak of the doubled frequency mode one can also employ some aperture or computer generated hologram, which can be conveniently combined with one of mirrors 4, 5.

In the case where multimode active region 2 comprises a material exhibiting also electo-optical properties, configuration of operating mode 5 in the system can be conveniently controlled with the help of external electric field E generated between two thin transparent electrodes 9. Thermo-optical effect can also be used to tune the system to its operating point.

Note, that actually only one half of the complete structure should be fabricated. To fabricate this structure one should first deposit on substrate 10 thin transparent electrode 9 such as 100 nm of a sputtered indium tin oxide (ITO) electrode. Then active electro-optical crystal 2 should be glued to the electrode and polished down to a thickness of about 20 μm. Finally, a few micrometers film of nonlinear material should be deposited to fabricate region 1. Cutting the obtained structure into two parts and combining them together results in a symmetric compound waveguide structure as shown in FIG. 3.

Figure 4:
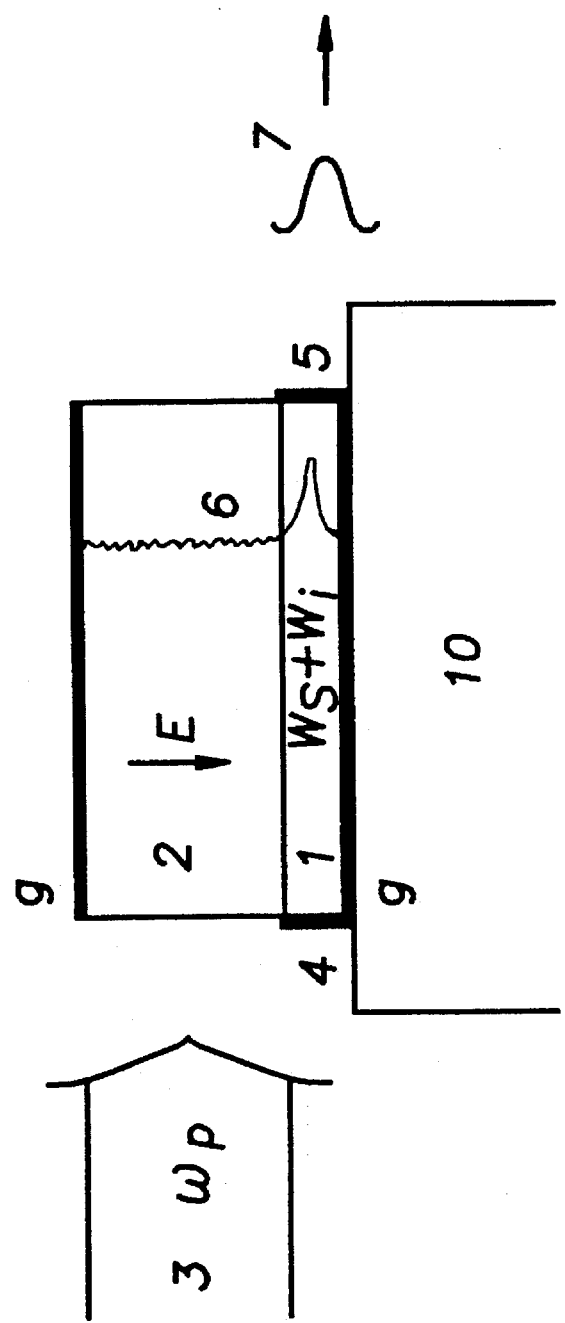
FIG. 4. Schematic of optical parametric oscillator based on asymmetric compound waveguide structure.

One preferred embodiment of an optical parametric oscillator based on asymmetric compound waveguide structure is shown in FIG. 4. The compound waveguide structure comprising single-mode nonlinear region 1 and multimode region 2 is pumped with powerful beam 3 at frequency $\omega_p$. As a result of three-wave mixing processes in nonlinear region 1 where waveguide mode 6 has its peak, two other modes at signal $\omega_s$ and idler $\omega_i$ frequencies are generated, where $\omega_p=\omega_s+\omega_i$ and the modes satisfy the corresponding phase match condition. In the case of parametric oscillator mirrors 4 and 5 are transparent at frequency $\omega_p$, but they are highly reflecting at frequencies ($R_4^{\omega_s}=R_4^{\omega_i}1, R_5^{\omega_s}=R_5^{\omega_i}<1$). The pump beam at frequency $\omega_p$ passes through the resonator, while signal and idler beam at frequencies $\omega_s$ and $\omega_i$ respectively are trapped in the resonator. In the case when mirrors 4 and 5 are made to be transparent also for the beam at idler frequency, the system operates as a singly resonant optical parametric oscillator generating output beam 7 at signal frequency $\omega_s$. Tuning the system to an operation point, where it has almost the same field configurations 6 with sharp central peaks inside nonlinear region 1 for the beam at all three frequencies, provides good overlap between these fields as required for efficient frequency conversion. In the case where a waveguide material in multimode region 2 exhibits electro-optical properties, such a tuning can be conveniently performed by electric field E generated between two transparent electrodes 8 and 9.

Note that mirrors 4 and 5 are not necessary in counter-propagating configuration of optical parametric oscillators and amplifiers. The feedback appears in this case as a result of interaction between counterpropagating signal and idler waves. It is very difficult to realize such a parametric oscillator based on standard scheme, since it is almost impossible to find nonlinear materials with high birefringence required for achieving phase matching. The optical parametric oscillator based on a compound waveguide structure provides a unique possibility for realization of the phase matching. Such optical parametric oscillator may find many potential applications as amplifiers and generators of tunable optical radiation.

The optical parametric oscillator described above can be combined with a laser pumping this oscillator. In this case multimode region 2 should comprise an active material which being pumped with some external beam generates light at pump frequency $\omega_p$. To provide a feedback for the light at pump frequency $\omega_p$, mirrors 4 and 5, shown in FIG. 4, should be made completely reflecting at this frequency $\omega_p$ ($R_4^{\omega_p}=R_5^{\omega_p}=1$).

Note, that a combination of the laser doubling the light frequency or generating higher order harmonics and the optical parametric oscillator described above provides a useful tool for increasing the light frequency and then its continuous adjusting using parametric frequency down conversion.

General schemes of short wavelength laser and optical parametric oscillator described above can be based on quite different waveguide structures and materials. In one preferred embodiment one can employ multimode fibers having an active (rare earth doped) compound core with appropriate central dip in their refractive index profile made to support propagation of a higher order mode with a sharp central peak. Such compound core active multimode fibers can be implemented in the design of enhanced power short wavelength fiber lasers or optical parametric oscillators compatible with single-mode fiber networks.

Enhanced power semiconductor lasers and optical parametric oscillators of a new type can also be designed using the principles described above. Radiation generated in semiconductor lasers is usually strongly confined in the plane of p-n junction. In the direction perpendicular to the plane of p-n junction the beam waist is about 1–2 µm, while in the direction parallel to this plane the beam width can be as large as 200 µm. A compound waveguide structure with low index central dip whose waveguiding layers perpendicular to the plane of p-n junction can be used to confine the laser radiation also in the direction parallel to the plane of p-n junction. Relatively large cross section of this active compound waveguide provides its efficient pumping while the width of the intensive central mode peak can be made as small as 1–2 µm.

In one preferred embodiment this semiconductor laser is based on such semiconductor materials such as AlGaAs. Well developed technology of organometallic vapor phase epitaxy (OMVPE) may be employed for its fabrication. Precise fabrication of the waveguide layers with well controllable thickness is routinely achieved using OMVPE technique. Numerical calculations made for the case of waveguide based on AlGaAs semiconductor materials suggest a structure of the waveguide dimensions as shown in FIG. 1(c) with the following parameters: $\lambda=0.85$ µm, $n_{ci}=3.5$, $n_2=3.8$, $n_1=3.51$, $d_1=2$ µm, $d_2=10$ µm. This waveguide structure exhibits the desired higher order mode with sharp central peak similar to that shown in FIG. 1(d). It follows from this figure that width of this peak is smaller than 2 µm. This feature can provide improvement in efficiency. Astigmatism typically present in common semiconductor lasers is removed, and the beam is essentially diffraction limited in both axis without an efficiency penalty.

To fabricate the planar multimode compound waveguide, the AlGaAs or another semiconductor material with appropriate thickness and refractive index should be grown. Multiple quantum well structures in semiconductor material can be employed to provide nonlinear properties in central region of the waveguide structure. Electro-optical properties of the multiple quantum well structure fabricated into outer waveguide layers can also be employed to control the system and to adjust it to the operating point with the help of an external electric field. Note, that the effect similar to the high order mode with sharp central peak can also be useful for quantum localization of electron and hole particles having high energy inside appropriately shaped quantum well structures. This provides a possibility of further improvement of performance of semiconductor based lasers and optical parametric oscillators.

In one preferred embodiment one can employ a multiple compound waveguides structures periodically spaced along the plane of p-n junction for realization of a semiconductor laser array. Appropriate superposition of fields from many periodically spaced sharp mode peaks will result in the laser array having very high brightness.

The inherent sensitivity that compound waveguides of this type exhibit to refractive index variations can be used to control beam directionality and laser cavity quality, and to achieve efficient modulation by simple variation of pumping current density. High sensitivity of sharp central peak to variations of the waveguide refractive index $n_2$, as illustrated in FIG. 2(b), guarantee a possibility for considerable improvement of the modulation rate.

Kerr nonlinearity in the active waveguide material can also be employed for Q-switching and mode locking the lasers to generate short pulses. High second order nonlinearity and electro-optical properties of multiple quantum well structures in the semiconductor material can be employed for fabrication of these miniature devices. In one preferred embodiment of pulsed waveguide laser with modulated Q-factor an operating point should be tuned to corresponding refractive index $n_{2cut}$, but remain below this value. Under such conditions the intensity of the field peak passing through an output aperture of the laser is very small and the laser is not able to generate a light beam providing, thus, conditions for effective pump of its active medium. The refractive index $n_2$ increases with the inversion of population resulting in increasing the intensity of the output beam peak used also as a feedback. Therefore the laser begins to generate. As the result of laser generation the inversion of population decreases resulting also in decreasing of refractive index $n_2$ and break down on the generation. In this way the laser generates a sequence of short, intensive pulses.

The described method of modulation of Q-factor can also be useful for design of powerful pulsed waveguide lasers with synchronization of longitudinal modes employing the same mode synchronization technique as have been developed for standard lasers. For example, in one preferred embodiment of a pulsed waveguide laser with synchronization of longitudinal modes one should only adjust length L of the active waveguide in such a way that a time interval between two consequently generated pulses is just equal to 2L n/c, where c is the velocity of light and n is average refractive index of the waveguide.

Having described preferred embodiments of the invention with reference to the accompanying drawings, it is to be understood that the invention is not limited to the precise embodiments, and that various changes and modifications may be effected therein by skilled in the an without departing from the scope or spirit of the invention as defined in the appended claims.

What is claimed is:

1. An enhanced power waveguide laser based on generation of higher order harmonics including frequency doubling comprising:

a compound, planar, active, multimode waveguide exhibiting both an amplification of an optical beam and an optical nonlinearity, said waveguide having a cladding and a compound core comprising two regions in its cross section, namely an active multimode region amplifying an optical beam and optionally exhibiting also electro-optical properties and a single-mode region exhibiting an appropriate optical nonlinearity, refractive index profile of said compound waveguide being chosen to support propagation of both a fundamental frequency mode and a higher order harmonic including doubled frequency mode of similar field configuration having tails in said active multimode region and sharp peaks in said single-mode region, said tail of said fundamental frequency mode field exhibiting amplification as it propagates through said active region of said compound waveguide, while said peak of said fundamental frequency mode field exhibits generation of higher order harmonics including frequency doubling as it propagates through said single-mode nonlinear region of said compound waveguide, said refractive index profile in said multimode region being also chosen to provide efficient field overlapping and phase matching between said fundamental frequency mode and said higher order harmonic including doubled frequency mode, as required for efficient frequency conversion;

a means to pump an active material in said active multimode region; and a means of optical feedback for said fundamental frequency mode having sharp peaks of its field.

2. The enhanced power waveguide laser of claim 1, wherein said compound multimode waveguide is a planar waveguide having an asymmetric structure comprising:

said multimode region bounded with said waveguide cladding having refractive index $n_{2cl}$, said single-mode region bounded with said waveguide cladding having refractive index $n_{1cl}$.

3. The enhanced power waveguide laser of claim 1, wherein said compound multimode waveguide is a planar or a fiber waveguide having a symmetric structure comprising:

said cladding of refractive index $n_{cl}$;

said multimode region in an outer region of said compound waveguide core;

said single-mode region which is a central region of said compound waveguide core.

4. The enhanced power waveguide laser of claim 1, wherein:

said means of pumping said active waveguide material comprises an optical source such as a diode laser;

said means of optical feedback for said fundamental frequency mode having sharp peaks comprises at least two mirrors and means for selection of said mode, such as a mode selecting aperture or computer generated hologram, said means of mode selection can be combined with said mirrors reflecting radiation of said fundamental frequency mode propagating through said multimode region placed between these mirrors; and said laser having also a means to select said higher order harmonic including doubled frequency mode having sharp peak of its field, said means can comprise an aperture, a computer generated hologram or an output optical fiber optically connected to said higher order harmonic including doubled frequency mode with sharp peak.

5. The enhanced power waveguide laser of claim 4, having at least two additional mirrors reflecting said higher order harmonic including doubled frequency radiation propagating through said single-mode region placed between these mirrors; and at least one of said mirrors being partially transparent.

6. The enhanced power waveguide laser of claim 5, wherein:

said multimode active region is an active crystal such as Nd:YAG, $GdVO_4:Nd^{3+}$ or $GdVO_4:Tu^{3+}$; and said nonlinear single-mode region comprises either a lower index nonlinear crystal such as KTP, KDP or a doped fused silica which is thermo-poled in a strong electric field to provide its nonlinear properties.

7. The enhanced power waveguide laser of claim 1, wherein:

said multimode region of said compound waveguide comprises active semiconductor materials such as AlGaAs or InP and may comprise also multiple quantum well structures to provide electro-optical properties and means to apply a controlling electric field across said multimode region;

said single-mode region of said compound waveguide is made from nonlinear semiconductor material such as multiple quantum well structures: and said means of pumping said active semiconductor material is an electric current.

8. The enhanced power waveguide laser of claim 7, wherein waveguiding layers of said compound multimode waveguide structure are perpendicular to the plane of p-n junction of said semiconductor structure.

9. An optical parametric oscillator for parametric amplification and frequency conversion in a compound multimode nonlinear waveguide comprising:

a compound multimode nonlinear waveguide, said waveguide having a cladding and a compound core comprising two regions in its cross section, namely a multimode region and a single-mode region; at least said single mode region exhibits a second order nonlinearity, said multimode region can also exhibit electro-optical properties, refractive index profile in said compound waveguide is chosen to support propagation of similar field configurations having tails in said multimode region and sharp peaks of their fields in said single-mode nonlinear region for higher order waveguide modes at three frequencies $\omega_p$, $\omega_s$ and $\omega_i$, such that $\omega_p = \omega_s + \omega_i$, wherein $\omega_p$ is a pump frequency, $\omega_s$ is a signal frequency and $\omega_i$ is an idler frequency, said peaks of said mode fields providing an efficient frequency conversion in said nonlinear single-mode region when said refractive index profile of said multimode pan is also chosen to provide required phase matching between said modes at said three frequencies;

a means of pumping said nonlinear single-mode region with a beam of frequency $\omega_p$;

a means of optical feedback for said signal frequency mode or for said idler frequency mode or for both the signal and idler frequencies modes.

10. The optical parametric oscillator of claim 9, wherein said means of optical feedback for said signal and/or idler frequency modes comprises at least two mirrors reflecting radiation at said frequencies propagating through said single-mode region placed between these mirrors, and at least one of said mirrors is partially transparent at said signal and idler frequencies; at least one of said mirrors can be combined with a means of selection of said signal frequency mode with sharp peak such as a mode selecting aperture or computer generated hologram.

11. The optical parametric oscillator of claim 9, wherein said means of pumping of said nonlinear single-mode region at frequency $\omega_p$ comprises:

said multimode region of said compound waveguide comprised of an active material, said active material being pumped with an external source, generating a higher order mode, at said pump frequency $\omega_p$ in said waveguide structure, having a sharp peak in said nonlinear single-mode region;

a means for optical feedback for said mode at frequency $\omega_p$ in said active waveguide structure; and a means for selection of said signal frequency mode.

12. The optical parametric oscillator of claim 11, wherein said means for optical feedback for said mode at frequency $\omega_p$ having a sharp peak comprises at least two mirrors and means for selection of said mode, such as a mode selecting aperture or computer generated hologram, said means of mode selection can be combined with at least one of said mirrors reflecting radiation of said mode propagating though said active waveguide structure placed between said mirrors.

13. The optical parametric oscillator of claim 11, wherein:

said multimode active region is an active crystal such as Nd:YAG, $GdVO_4$:$Nd^{3+}$ or $GdVO_4$:$Tu^{3+}$;

said multimode active region is pumped with a light source such as a diode laser; and said nonlinear single-mode region is either a lower index nonlinear crystal such as KTP, KDP or a doped fused silica which is thermo-poled in strong electric field to provide its nonlinear properties.

14. The optical parametric oscillator of claim 11, wherein:

said multimode region of said compound waveguide comprises an active semiconductor material such as AlGaAs or InP and may comprise also multiple quantum well structures to provide its electro-optical properties and means to apply an electric field across said multimode region;

said active semiconductor material is pumped with an electric current;

said single-mode region of said compound waveguide comprises a nonlinear semiconductor material, such as multiple quantum well structures; and waveguiding layers of said compound multimode waveguide structure are perpendicular to the plane of p-n junction of said semiconductor structure.

15. The optical parametric oscillator of claim 9, wherein said compound multimode waveguide is a planar waveguide having an asymmetric structure comprising:

said multimode region bounded with said waveguide cladding having refractive index $n_{2cl}$, said single-mode region bounded with said waveguide cladding having refractive index $n_{1cl}$.

16. The optical parametric oscillator of claim 9, wherein said compound multimode waveguide is a planar or a fiber waveguide having a symmetric structure comprising:

a cladding of refractive index $n_{cl}$;

said multimode region in an outer region of said compound waveguide core;

said single-mode region being a central region of said compound waveguide core.

17. The optical parametric oscillator of claim 9, having a means to modulate said refractive index profile in said multimode region of said compound waveguide to simultaneously change its signal and idler frequencies by controlling said condition of phase matching required for efficient frequency conversion.

18. The optical parametric oscillator of claim 17, wherein said means of modulation of said refractive index profile in said multimode region of said compound waveguide comprises an electric field applied across said multimode region made from a nonlinear material exhibiting electro-optical properties.

19. The optical parametric oscillator of claim 18, wherein said electric field is generated between two electrodes, said multimode region placed between said electrodes which can be made from optically transparent material.

20. The optical parametric oscillator of claim 9, wherein said signal and idler modes are counterpropagating waves, and said means of optical feedback for said signal frequency mode comprises interaction between said counterpropagating modes.

* * * * *